United States Patent [19]

Heberling et al.

[11] Patent Number: 4,840,286
[45] Date of Patent: Jun. 20, 1989

[54] EQUIPMENT ENCLOSURE WITH INTERNAL FASTENERS

[75] Inventors: James R. Heberling, Lawrenceville; Mark Hicks, Norcross; Nancy Watts, Marietta, all of Ga.

[73] Assignee: Hayes Microcomputer Products, Inc., Norcross, Ga.

[21] Appl. No.: 159,069

[22] Filed: Feb. 23, 1988

[51] Int. Cl.$^4$ .............................................. H05K 7/20
[52] U.S. Cl. .................................... 220/306; 220/307; 361/383; 361/392
[58] Field of Search ............... 361/380, 382, 383, 390, 361/392, 393, 395, 396, 399; 174/16 R, 52 R, 16.1, 52.1; 220/306 X, 307, 4 BX, 4 E; 200/303

[56] References Cited

U.S. PATENT DOCUMENTS

| | | | |
|---|---|---|---|
| 4,163,503 | 8/1979 | McKinnon | 220/307 |
| 4,215,796 | 8/1980 | Johnston | 220/306 |
| 4,245,274 | 1/1981 | MacDonald | 361/392 |
| 4,549,670 | 10/1985 | Trendler | 220/307 |
| 4,635,809 | 1/1987 | Bachman | 220/4 B |
| 4,652,969 | 3/1987 | Stegenga | 220/4 E |
| 4,728,914 | 3/1988 | Morris | 361/383 |
| 4,746,008 | 5/1988 | Heverly | 220/306 |

*Primary Examiner*—Gerald P. Tolin
*Attorney, Agent, or Firm*—Jones, Askew & Lunsford

[57] ABSTRACT

An enclosure for housing electrical equipment and components includes a base and a cover that are releasably connected with internal fasteners. The base has an upturned peripheral portion and the cover has a downturned peripheral portion. The fastener assembly includes a tooth and a detent that are located internally on the peripheral portions for sliding engagement with one another to releasably connect the base and cover.

5 Claims, 4 Drawing Sheets

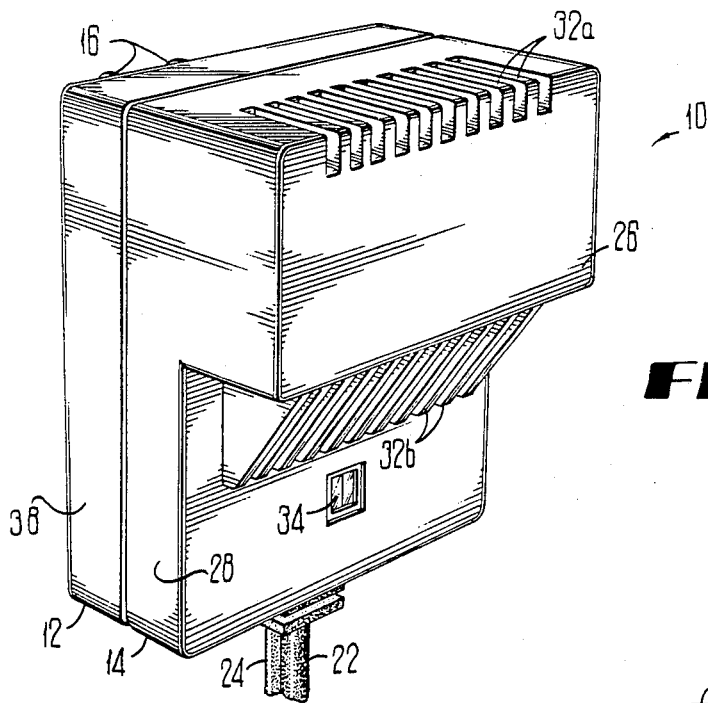
FIG 1
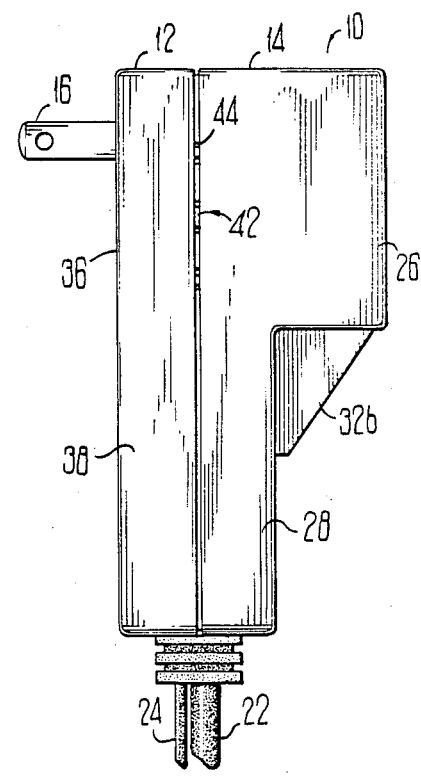
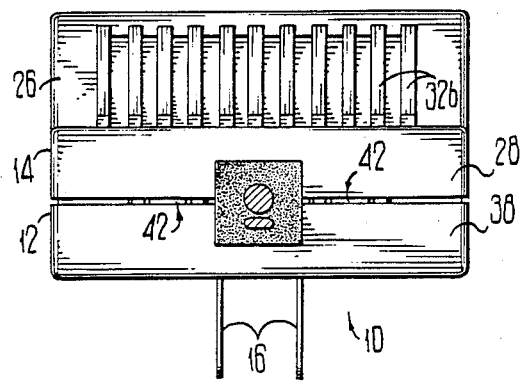
FIG 3          FIG 2

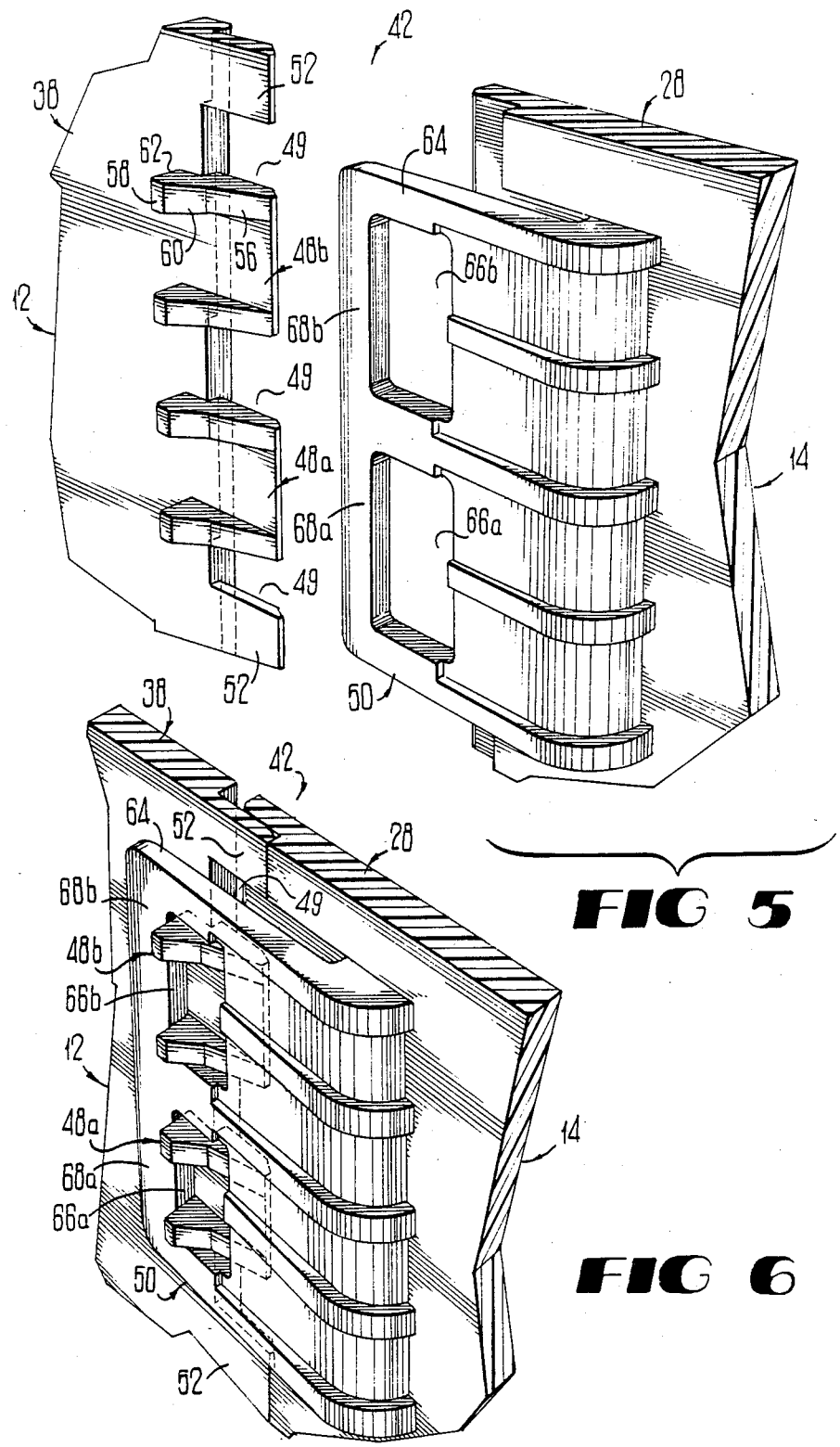

EQUIPMENT ENCLOSURE WITH INTERNAL FASTENERS

TECHNICAL FIELD

This invention pertains to equipment enclosures, and more particularly to enclosures for housing electrical and electronic equipment.

BACKGROUND ART

It is desirable to provide enclosures for various type of equipment, particularly electrical and electronic equipment. Many pieces of electronic equipment and electronic components may be mounted in a housing to protect the equipment or components from undesirable environmental effects such as dust and moisture and to prevent inadvertent tampering. An enclosure can also provide an aesthetically pleasing appearance for the electronic equipment.

In the past, electronic components and equipment were housed in a box or cabinet that protected the components and obscured them from view. Cabinets were often constructed of metal and held together with screws or similar fasteners with removable panels to provide access for maintenance and service. As with other items of manufacture, metal enclosures are being replaced with plastic enclosures which are lighter in weight and easier to fabricate. Typically, an enclosure for electronic equipment consists of molded plastic parts which are held together with self-tapping screws that can be removed to disassemble the housing for access to the components therein. While an effective enclosure can be provided in this manner, using screws to fasten the housing portions together increases the assembly time of the housing and also increases the time required to gain access to the components for servicing.

Molded plastic electrical equipment enclosures are also manufactured so that the molded sections are hingedly connected together and are fastened with molded plastic or metal latches. Enclosures constructed with the hinged sections and latches are easy to manufacture and provide easy access to the electrical components, but the hinges and latches are located on the exterior of the enclosure and sometimes present an unsightly appearance. Accordingly, it will be understood that it would be highly desirable to provide an electrical equipment enclosure which has concealed fasteners and presents a neat, clean, uncluttered appearance.

SUMMARY OF THE INVENTION

The present invention is directed to overcoming the problems set forth above. Briefly summarized, an equipment enclosure includes a base and a cover that have fasteners for connecting the base and cover to form a unitary enclosure. The enclosure is of molded construction and presents a neat, compact appearance that is free of external protrusions. The fasteners are constructed so that the cover stands off from the base a preselected distance to improve the appearance of the enclosure and to provide auxiliary ventilation. The base and cover can be separated with a tool for maintenance and servicing of the electronic components housed therein.

It is an object of the present invention to provide an enclosure suitable for housing electronic equipment and components. The equipment enclosure forms a cavity for receiving electronic equipment and components. When used as a housing for a modem, the modem is completely enclosed within the enclosure and the enclosure is free of any external protrusions except for terminals required to make the necessary electrical connections.

Another object of the present invention is to provide an equipment enclosure that is free of external protrusions. This object is achieved by providing fasetners for connecting the base and cover of the enclosure that are located on the interior of the base and cover. When assembled in a unitary structure, the base and cover are fastened with the internal fasteners and there are no fasteners or hinges visible from the exterior of the equipment enclosure.

Another object of the present invention is to provide an equipment enclosure with ventilation. Ventilation is provided by arranging the fasteners connecting the base and cover so that air can circulate through openings in the fasteners and around the equipment housed in the enclosure.

Other aspects, objects, features and advantages of the present invention will become apparent to those skilled in the art upon reading the detailed description in conjunction with the accompanying drawings and appended claims.

BRIEF DESCRIPTION OF THE DRAWINGS

FIG. 1 is an assembled perspective view of a preferred embodiment of an equipment enclosure.

FIG. 2 is a left elevational view of the enclosure of FIG. 1.

FIG. 3 is a bottom plan view of the enclosure of FIG. 1.

FIG. 5 is a detailed perspective view of the disassembled enclosure of FIG. 4 illustrating a fastener assembly having a pair of teeth and a double detent.

FIG. 6 is a detailed perspective view of the enclosure of FIG. 4 illustrating the teeth and a double detent assembled.

DETAILED DESCRIPTION OF THE PREFERRED EMBODIMENTS

Figures 4, 9:
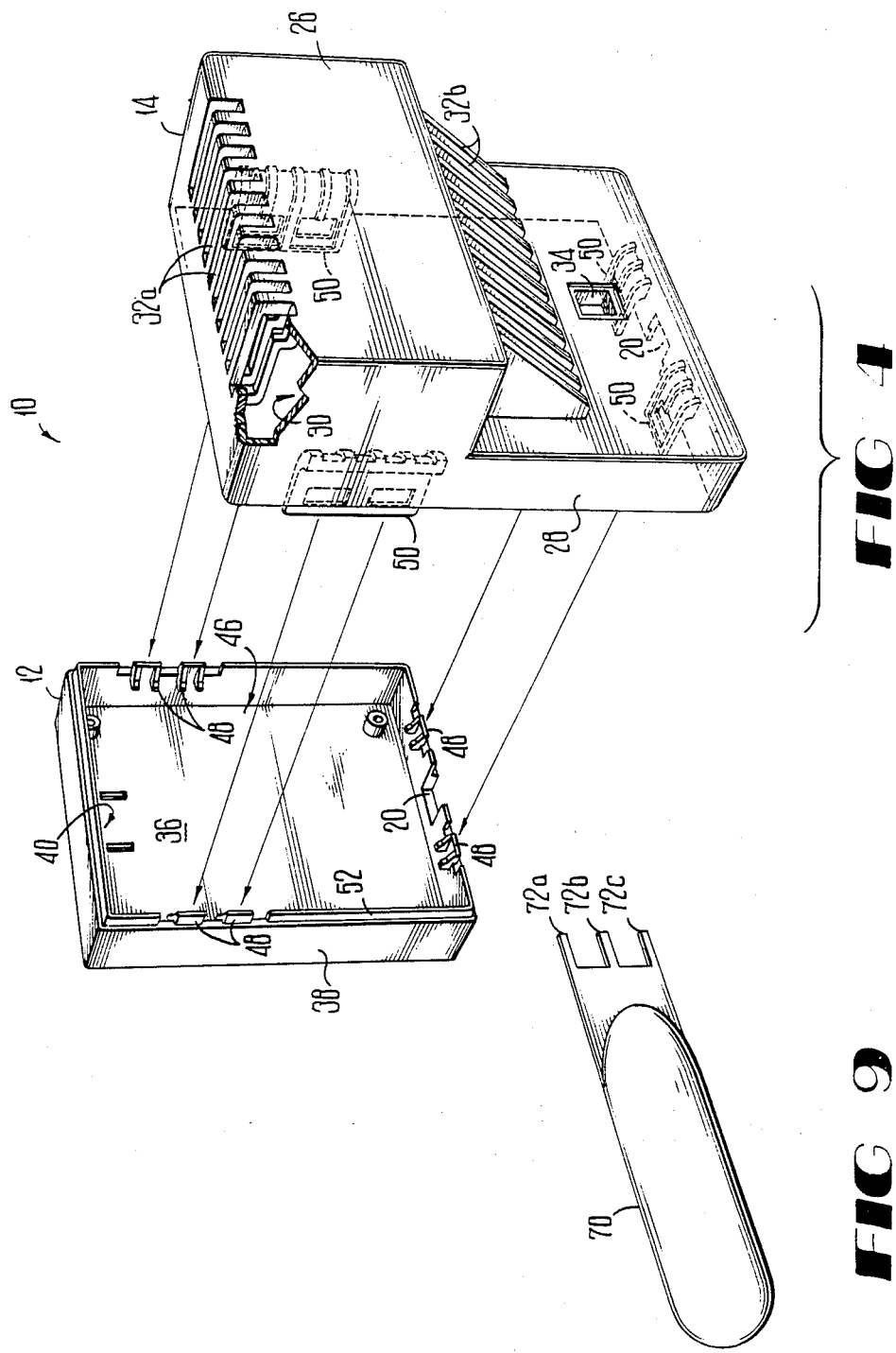
FIG. 4 is an disassembled perspective view of the enclosure of FIG. 1 revealing an internal fastener assembly.
FIG. 9 is a perspective view of a preferred embodiment of a tool for disassembling the equipment enclosure of FIG. 1.

Referring to FIGS. 1–4, an equipment enclosure 10 has base 12 and a cover 14. In the preferred embodiment illustrated, the enclosure 10 houses the electrical and electronic components of a modem (not shown). Preferably the electrical moden components are mounted on the base 12 with electrodes 16 extending from the interior of the enclosure 10 through openings in the base. Preferably, the base 12 also has an opening 20 through which connecting cables 22 and 24 pass for interfacing the modem with a computer and a telephone set (not shown). The opening 20 could also be formed in the cover 14 or could be shared by the base 12 and cover 14.

The cover 14 has a general pan-like configuration including a top portion 26 and a peripheral portion 28 connected to the top portion 26. The peripheral portion 28 is downturned from the top portion 26 and defines a cover cavity 30. The cover 14 has a plurality of protrusions or ribs 32a and 32b. The cover 14 also has an opening 34 for observing indicator lights associated with electronic circuitry contained within the enclosure 10. The area of the ribs 32a, 32b may be slotted to increase ventilation.

The base 12 of the enclosure 10 also has a general pan-like configuration and includes a bottom portion 36 and an upturned peripheral portion 38 that is connected to the bottom portion 36 and defines a base cavity 40.

Still referring to FIGS. 1-4, a two-part fastener assembly 42 releasably connects the base 12 and cover 14 preferably leaving an opening 44 to aid ventilation by circulating cooling air to the enclosure cavity 46. The enclosure cavity 46 is a cavity existing on the interior of the enclosure 10 that is formed by the cover cavity 30 and the base cavity 40. The power supply circuit boards and other modem components are positioned in the enclosure cavity 46.

Referring to FIGS. 5-6, the two-part fastener assembly 42 includes a pair of teeth 48a, 48b and a double detent 50. The detent 50 is semi-flexible to snap into place over the teeth 48 and is preferably constructed of a material such as a polycarbonate that is preferably pigmented to a desirable coloration. The tooth 48 and other portions of the enclosure 10 can also be constructed of a pigmented polycarbonate material.

As illustrated in FIGS. 5-6, the teeth 48 are connected to the up-turned peripheral portion 38 of the base 12 and the detent 50 is connected to the downturned peripheral portion 28 of the cover 14, but their positions are reversible (see FIGS. 7-8), so that detent 50' is positioned on the base and the teeth 48' are positioned on the cover. The positions are also interchangeable so that teeth 48 and detent 50 can both be located on either the base 12 or cover 14 for engagement with a corresponding detent 50 or teeth 48 on the cover 14 or base 12.

Referring to FIG. 5, the teeth 48 are located on the backward L-shaped portion 52 of the upturned peripheral portion 38 of the base 12. Each tooth 48 is located on the backside of the longer leg of the L 52. The L-shaped portion is slotted so that a slot, opening, or space 49 exists on each side of each tooth 48 to provide access to the detent 50. The opening 40 also aids somewhat in ventilation by forming a passaway to the enclosure cavity 46 from the atmosphere. Each tooth 48 has a general right triangular configuration with the longer leg of the triangle affixed to the backside of the L 52 so as to position the hypotenuse 54 of the triangle for sliding engagement with the detent 50.

The hypotenuse 54 is composed of first and second segments 56 and 58. The first segment 56 forms an acute angle with the longer leg of the triangle and the second segment 58 is positioned generally parallel to the longer leg. The hypotenuse 54 also includes a third segment 60 that is positioned between the first and second segments 56 and 58. The third segment 60 is angularly oriented relative to the long leg of the triangle and forms an obtuse angle with the first segment 56 and also forms an obtuse angle with the second segment 58. These obtuse angles cooperate to provide a inclined step or ramp-like profile. The interior angle formed by the long leg of the triangle and an extension of the third segment 60 is an acute angle.

The corner formed at the junction of the second and third segments 58, 60 is preferably rounded to facilitate sliding engagement with the detent 50. When the fastener assembly 42 is connected, the detent 50 engages the short leg 62 of the triangularly configured tooth 48.

Figure 7:
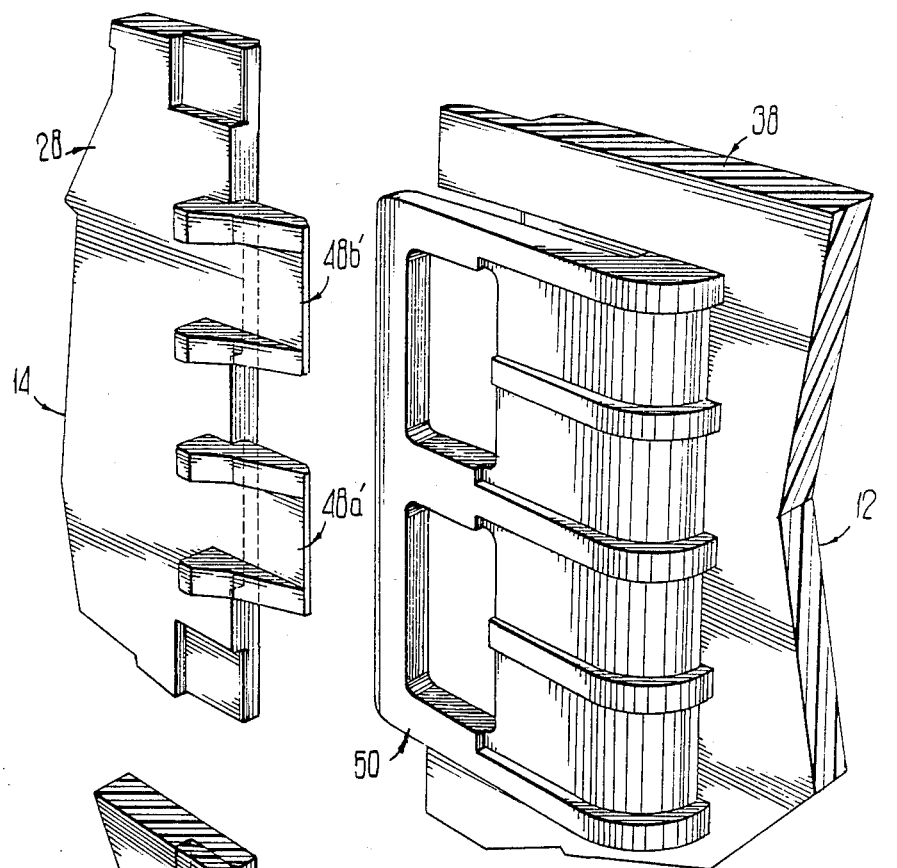
FIG. 7 is a detailed perspective view of a disassembled enclosure similar to FIG. 5 but illustrating a different embodiment.

Referring to FIG. 7, the downturned peripheral portion 28 of the cover 14 also has a general inverted L-shaped shaped cross-sectional configuration with a front side of the L adjacent the cover cavity 30. When the teeth 48' are connected to the cover 14, the teeth 48' are affixed to the front side of the L in the cover cavity 30 and are positioned to avoid interference with the mating of the L shaped peripheral portions of the base and cover (FIG. 8).

Referring to FIGS. 5-6, the detent 50 comprises a resilient member 64 defining openings 66a and 66b. The resilient member 64 has catches 68a, 68b adjacent the openings 66a, 66b arranged so that the catches 68 slide over the hypotenuses 54 of the teeth and engage the short leg 62 of the triangularly configured teeth. When the catch 68 and short leg 62 are engaged, portions of the second and third segments 58 and 60 protrude through each opening 66. Whenever the teeth 48 are attached to the upturned peripheral portion 38 of the base 12, then the detent 50 is connected to the downturned peripheral portion 28 of the cover 14 at a distance from an edge of the peripheral portion 38 sufficient for maintaining the detent 50 free of interference with the edge portion when connecting the base 12 and cover 14.

Figure 8:
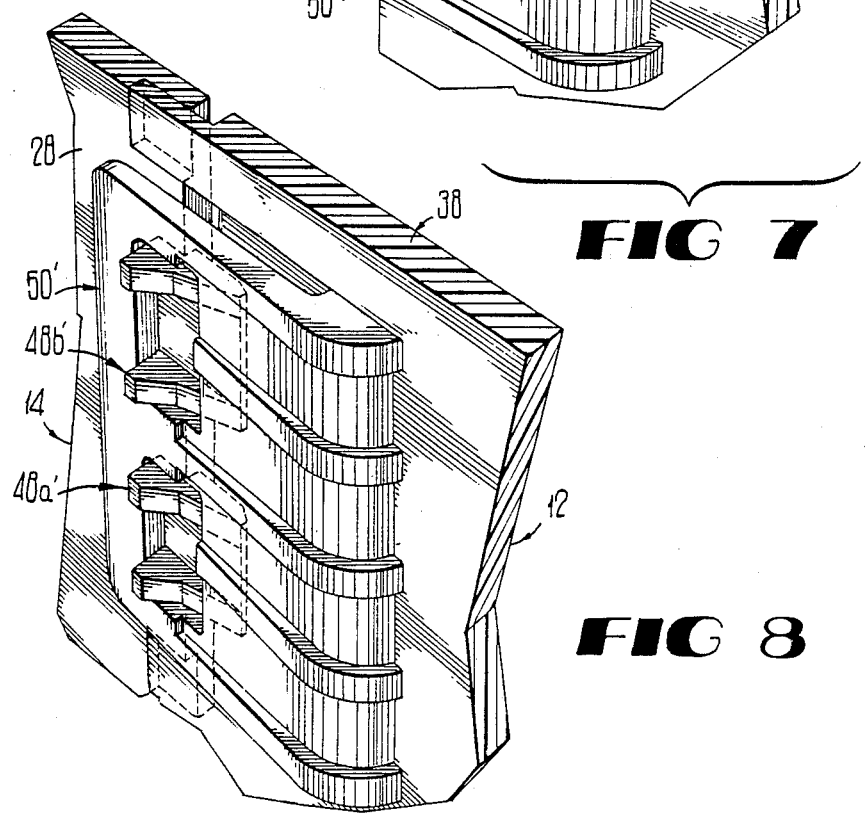
FIG. 8 is a detailed perspective view of an assembled enclosure similar to FIG. 6 but illustrating a different embodiment that shows the pair of teeth and double detent of FIG. 7 assembled.

Similarly, as shown in FIGS. 7-8, the detent 50' can be attached to the upturned peripheral portion 38 of the base 12 at a position sufficient for engaging the teeth 48' that would be connected to the cover 14.

The number of fastener assemblies 42 provided for an enclosure 10 depends upon the overall dimensions and function of the enclosure 10. Where the enclosure 10 has a rectangular configuration, a fastener assembly 42 could be positioned along two or more sides of the rectangular configuration. Also, it may be desirable to use a single fastener assembly that includes a detent with one opening 66 and one catch 68 for engaging one tooth 48. Such a singular configuration would be easier to manufacture but the double configuration is preferred where more fastening power is desired.

Each opening 66 has a slightly larger lateral dimension that the mating tooth 48 sufficient for easily engaging the tooth 48 but not so large that it prevents the resilient member 64 from being accessible through the slots 49 that exist adjacent each tooth. A pointed tool 70 having a number or tines or fingers 72 a, b, c can be inserted through the slots 49 to act on the resilient member 64 to disengage the detent 50 and tooth 48 for disassembly of the enclosure 10 (FIG. 9). The resilient member 64 overlaps the tooth 48 so that the openings 49 adjacent the tooth 48 are not in direct communication with the enclosure cavity 46. By this construction, an indirect ventilation passageway is formed that maintains electrical components in the enclosure cavity 46 free of intereference with the pointed tool 70 or other objects inserted into the opening 49.

While operation of the equipment enclosure with internal fasteners is believed to be apparent from the foregoing description, a few words will be added for emphasis. The equpiment enclosure 10 is assembled by pressing the cover 14 into place on the base 12. When properly aligned for assembly, a detent 50 is aligned with corresponding teeth 48 and is pressed onto the teeth 48. Pressing the cover 14 onto the base 12 causes the catch 68 of the detent 50 to slidingly engage the hypotenuses 54 of the teeth 48.

As engagement begins, the catch 68 engages the first tooth segment 56 and slides thereon toward the third tooth segment 60. Because the first segment 56 is angled, it forces detent 50 inwardly in the enclosure cavity 46. Further urging of the detent 50 onto the tooth 48 causes the catch 68 to slide from the first segment 58 onto the third segment 60 and causes the detent to further flex inward into the enclosure cavity 46. Still further urging causes the catch 68 to slide from the third segment 60 onto the second segment 58 and ultimately off of the second segment 58 where the detent 50 is then free to attempt to snap back to its original position.

When the detent 50 attempts to return to its original position, the catch 68 engages the short leg 62 of the triangularly configured tooth 48 and thereby locks the tooth and detent which in turn latch the base 12 and cover 14. When latched, the second segment 58 and a portion of the third segment 60 protrude through the opening 66 in the resilient member 64 of the detent 50. During the time the second and third segments 58 and 60 of the tooth 48 project through the opening 66 of the resilient member 64, the base and cover can not be inadvertently separated and will remain together during normal use, storage, and transportation. Because the resilient member 64 acts to spring load the catch 68 on the short leg 62 of the tooth 48, the base 12 and cover 14 will also survive shock encountered by unintentially dropping the enclosure 10.

Access to the interior of the enclosure is gained by urging the resilient member 64 towards the interior of the enclosure cavity 46. The inward motion of the resilient member 64 causes the catch 68 to slide over the short leg 62 and removes the second and third segments 58 and 60 from the opening 66 of the resilient member 64. This frees the catch 68 for sliding engagement with the second segment 58, then the third segment 60 and finally the first segment 56. As the catch 68 moves from the second segment 58 to the first segment 56, the tension on the resilient member is reduced as the base 12 and cover 14 are pulled apart. The resilient member 64 is most easily disengaged from the tooth 48 by insertion of the pointed tool 70 so that the fingers 72a, b, c extend into the slits or openings 49 alongside teach tooth to urge the resilient member 64 into the enclosure cavity 46 to thereby disengage the catch and short leg 62 of the tooth.

While the invention has been described with reference to the preferred embodiments, it will be understood by those skilled in the art that various changes may be made and equivalents may be substituted for elements of the preferred embodiments without departing from the invention. In addition, many modifications may be made to adapt a particular situation and material to a teaching of the invention without departing from the essential teachings of the present invention. For example, while the invention has been described as an enclosure for a modem, the equipment enclosure is equally useful for housing other types of electrical and electronic equipment as well as equipment in general. The equipment enclosure also makes an excellent shipping case that resists inadvertent opening. The fastener assemblies are located internally thereby providing a stackable, tamper-resistant, aesthetically pleasing, enclosure. The equipment enclosure and the fasteners can be easily fabricated from moldable materials, such as polycarbonates, pigmented to be aesthetically pleasing.

Also, while the invention has been illustrated and described as though the peripheral portions form generally right angles with their respective base and cover portions, other angles may be formed without departing from the invention. A wide range of angles can be used as long as corresponding detents and teeth engage and disengage as described.

As is evident from the foregoing description, certain aspects of the invention are not limited to the particular details of the examples illustrated, and it is therefore contemplated that other modifications or applications will occur to those skilled in the art. For example, the resilient member 64 may be made thinner than illustrated to increase flexibility or may be reinforced to increase resistance to breaking. It is accordingly intended that the claims should cover all such modifications and applications as do not depart from the true spirit and scope of the invention.

We claim:

1. An equipment enclosure, comprising:
   a base having a bottom portion and an upturned peripheral portion connected to said bottom portion and defining a base cavity, said upturned peripheral portion, having a general L-shaped cross-sectioned configuration with a backside of the "L" adjacent said base cavity;
   a cover having a top portion and a downturned peripheral portion connected to said top portion and defining a cover cavity, said base cavity and cover cavity forming an enclosure cavity; and
   a fastener having a first tooth connected to one of said upturned peripheral portion and downturned peripheral portion, said first tooth having a general right triangular configuration with a longer side affixed to said "L" and having a segmented hypotenuse composed of first second, and third segments, said first segment forming an acute angle with said longer side, said second segment being positioned generally parallel to said longer side, said third segment being positioned between said first and second segments, said fastener also having a first detent connected to the other of said upturned peripheral portion and downturned peripheral portion and positioned for sliding engagement with said hypotenuse, said first detent engaging said first tooth in said enclosure cavity and releasably connecting said base and said cover.

2. The equipment enclosure of claim 1, wherein said third segment is acutely and angularly positioned relative to said longer side and forms an obtuse angle with said first segment and with said second segment.

3. An equipment enclosure, comprising:
   a base having a bottom portion and an upturned peripheral portion connected to said bottom portion and defining a base cavity;
   a cover having a top portion and a downturned peripheral portion connected to said top portion and defining a cover cavity, a portion of said downturned peripheral portion of said cover having a general inverted L-shaped cross-sectional configuration with a frontside of the "L" adjacent said cover cavity, said base cavity and cover cavity forming an enclosure cavity; and
   a fastener having a first tooth connected to one of said upturned peripheral portion and downturned peripheral portion, said first tooth having a general right triangular configuration with a longer side affixed to said "L" and having a segmented hypotenuse composed of first, second, and third segments, said first segment forming an acute angle with said longer side, said second segment being positioned generally parallel to said longer side, said third segment being positioned between said first and second segments, said fastener also having a first detent connected to the other of said upturned peripheral portion and downturned peripheral portion and positioned for sliding engagement with said hypotenuse said first detent engaging said first tooth in said enclosure cavity and releasably connecting said base and said cover.

4. The equipment enclosure of claim 3, wherein said third segment is acutely angularly positioned relative to said longer side and forms an obtuse angle with said first segment and with said second segments.

5. An equipment enclosure, comprising:

a base having a bottom portion and an upturned peripheral portion connected to said bottom portion and defining a base cavity;

a cover having a top portion and a downturned peripheral portion connected to said top portion and defining a cover cavity, said base cavity and cover cavity forming an enclosure cavity; and a fastener releasably fastening together said base and cover along a first axis, comprising:

tooth member attached to one of said base and cover;

a deflectable detent member having a first end attached to the other of said base and cover and a second end opposite said first end, said deflectable detent member having proximate its first end a first catch engaging said tooth member, said tooth, member defining a locking surface in locking engagement with said first catch, and also defining an inclined sliding contact surface in sliding contact with said first catch during sliding engagement prior to the locking of said tooth member and said catch said sliding contact surface having a first inclined portion and a second inclined portion said inclined portions defining different acute angles relative to said first axis, said second portion being contacted by said catch after contacting said first portion during said sliding engagement and having a greater inclination than said first portion, such that said deflectable detent member is deflected at a greater rate during contact with said second portion than during contact with said first portion.

* * * * *